United States Patent
Schwartz

(10) Patent No.: US 11,283,511 B2
(45) Date of Patent: Mar. 22, 2022

(54) SYSTEM WHICH SUPPORTS BOTH TDD AND FDD, WITH SIGNAL SEPARATION

(71) Applicant: Elta Systems Ltd., Ashdod (IL)

(72) Inventor: Adi Schwartz, Holon (IL)

(73) Assignee: ELTA SYSTEMS LTD., Ashdod (IL)

( * ) Notice: Subject to any disclaimer, the term of this patent is extended or adjusted under 35 U.S.C. 154(b) by 58 days.

(21) Appl. No.: 16/830,998

(22) Filed: Mar. 26, 2020

(65) Prior Publication Data
US 2020/0313753 A1 Oct. 1, 2020

(30) Foreign Application Priority Data
Mar. 28, 2019 (IL) .......................................... 265699

(51) Int. Cl.
| | |
|---|---|
| *H04B 7/155* | (2006.01) |
| *H04L 5/14* | (2006.01) |
| *H03F 1/26* | (2006.01) |
| *H04W 88/14* | (2009.01) |

(52) U.S. Cl.
CPC ........... *H04B 7/15557* (2013.01); *H03F 1/26* (2013.01); *H04L 5/1469* (2013.01); *H04W 88/14* (2013.01); *H03F 2200/294* (2013.01); *H03F 2200/372* (2013.01)

(58) Field of Classification Search
CPC ..... H04B 7/15557; H04B 7/14; H04L 5/1469; H04L 5/14; H03F 1/26; H03F 2200/372; H03F 2200/294; H04W 88/14; H04W 84/047
USPC ........ 370/273, 275, 276–278, 280–281, 294, 370/295, 297
See application file for complete search history.

(56) References Cited

U.S. PATENT DOCUMENTS

| | | |
|---|---|---|
| 9,059,770 B2 | 6/2015 | Koifman et al. |
| 9,220,048 B2 | 12/2015 | Schwartz et al. |
| 9,351,173 B2 | 5/2016 | Giloh et al. |
| 9,369,941 B2 | 6/2016 | Shoshan et al. |
| 9,451,476 B2 | 9/2016 | Shoshan et al. |
| 9,544,783 B2 | 1/2017 | Shoshan et al. |
| 2005/0255812 A1 | 11/2005 | Na |
| 2013/0059585 A1 | 12/2013 | Koifman |
| 2013/0336199 A1 | 12/2013 | Schwartz |

(Continued)

FOREIGN PATENT DOCUMENTS

| | | |
|---|---|---|
| IL | 221322 | 9/2016 |
| WO | 2011092698 A1 | 8/2011 |

(Continued)

OTHER PUBLICATIONS https://en.wikipedia.org/w/index.php?title=RF_front_end&oldid=809610256.

(Continued)

*Primary Examiner* — Afshawn M Towfighi
(74) *Attorney, Agent, or Firm* — Browdy and Neimark, PLLC

(57) ABSTRACT

An RF communication system supporting both TDD and FDD and including an FDD duplexer coupled to an antenna; a first pair of FDD/TDD switches each coupled to the duplexer and to a Tx/Rx switch via a sub-band switch; and a second pair of FDD/TDD switches coupled to the Tx/Rx switch including a first FDD/TDD switch coupled to a baseband processor via an amplifier and down converter and a second FDD/TDD switch coupled to a baseband processor via an amplifier and up converter.

21 Claims, 14 Drawing Sheets

(56) References Cited

U.S. PATENT DOCUMENTS

| | | |
|---|---|---|
| 2013/0336289 A1 | 12/2013 | Koifman |
| 2014/0071884 A1 | 3/2014 | Sherman |
| 2015/0004962 A1 | 1/2015 | Weisbart et al. |
| 2015/0016330 A1 | 1/2015 | Koifman |
| 2015/0229463 A1* | 8/2015 | Oh .................. H04B 1/0057 370/278 |
| 2015/0230258 A1* | 8/2015 | Kwon ................ H04W 72/082 370/280 |
| 2015/0259078 A1 | 9/2015 | Filipovic et al. |
| 2015/0270889 A1 | 9/2015 | Shoshan |
| 2015/0351116 A1 | 12/2015 | Shoshan |
| 2016/0099747 A1 | 4/2016 | Koifman |
| 2016/0112114 A1 | 4/2016 | Shoshan |
| 2016/0119050 A1 | 4/2016 | Koifman |
| 2016/0134438 A1* | 5/2016 | Marzetta ........... H04L 25/0228 370/315 |
| 2016/0164622 A1* | 6/2016 | Yi ....................... H04L 5/14 370/280 |
| 2016/0255667 A1 | 9/2016 | Schwartz |

FOREIGN PATENT DOCUMENTS

| | | |
|---|---|---|
| WO | 2013118123 A1 | 8/2013 |
| WO | 2016199144 A1 | 12/2015 |

OTHER PUBLICATIONS www.rfwireless-world.com/Terminology/LTE-EARFCN-to-frequency-conversion.html—Dec. 17, 2017.
www.electronics-notes.com—Jan. 31, 2019.
www.thinksmallcell.com—2020.
https://www.slideshare.net/darcypoulin/tdd-versus-fdd—Oct. 15, 2009.
http://niviuk.free.fr/lte_tdd.php (https://www.sqimway.com/lte_tdd.php)—Dec. 2017.
http://slideplayer.com/slide/6949321/—Dec. 2017.

* cited by examiner

Fig. 10

1. relay base station = BSF is starting up
↓
2. the BSF's co-located rMS (aka MSF, aka rUE) searches for
3. a remote eNB or base station
↓
3. rMS (or mobile station functionality) connects to one of the available eNBs or base stations
↓
4. rMS connects to one of the neighboring cell its collocated eNB or base station starts up on the other sub-band EARFCN (access sub-band)
↓
5. rMS (or mobile station functionality) measures other neighboring eNBs that are on its backhauling sub-band, or all the eNB in the bands when the eNB or base station is not transmitting

SYSTEM WHICH SUPPORTS BOTH TDD AND FDD, WITH SIGNAL SEPARATION

REFERENCE TO CO-PENDING APPLICATIONS none.

FIELD OF THE INVENTION

The present invention relates generally to wireless communication systems and more particularly to cellular communication systems.

BACKGROUND

Wikipedia describes that the RF front end in a radio receiver circuit refers typically to all circuitry from the antenna up to (and including) the mixer stage including the components in the receiver that process the signal at the original incoming radio frequency (RF), before the signal is converted to a lower intermediate frequency (IF). In microwave and satellite receivers the RF front end is called a low-noise block (LNB) or low-noise downconverter (LND) and may be located at the antenna, so that the signal from the antenna can be transferred to the rest of the receiver at the more easily handled intermediate frequency.

For most superheterodyne architectures, the RF front end includes all or any subset of the following:
a. A band-pass filter (BPF) to reduce image response. This removes any signals at the image frequency, which would otherwise interfere with the desired signal. It also prevents strong out-of-band signals from saturating the input stages.
b. An RF amplifier, often called the low-noise amplifier (LNA). Its primary responsibility is to increase the sensitivity of the receiver by amplifying weak signals without contaminating them with noise, so that they can stay above the noise level in succeeding stages. It must have a very low noise figure (NF). The RF amplifier may not be needed and is often omitted (or switched off) for frequencies below 30 MHz, where the signal-to-noise ratio is defined by atmospheric and man-made noise.
c. A local oscillator (LO) which generates a radio frequency signal at an offset from the incoming signal, which is mixed with the incoming signal.
d. a mixer, which mixes the incoming signal with the signal from the local oscillator to convert the signal to the intermediate frequency (IF).

In digital receivers, particularly those in wireless devices such as cell phones and Wifi receivers, the intermediate frequency is digitized, sampled and converted to a binary digital form, and the rest of the processing—IF filtering and demodulation—is done by digital filters (digital signal processing, DSP), as these are smaller, use less power, and can have more selectivity. The RF front end is then defined to include all hardware from the antenna to the analog to digital converter (ADC) which digitizes the signal. Typically, as much of the signal processing is done in digital form, to the extent that some receivers even digitize the RF signal directly, i.e. without down-conversion to an IF, the front end may comprise only an RF filter.

Typically, both of the front ends are the enablers of the relay.

A technical description of EARFCN including computing EARFCN by central frequency and conversely, computing central frequency by EARFCN, is described here: www.lte-handbooks.com/2015/11/lte-central-frequency-and-earfcn.html and here: www.rfwireless-world.com/Terminology/LTE-EARFCN-to-frequency-conversion.html www.electronics-notes.com maintains (emphasis added) that "One of the key elements of any radio communications system is the way in which radio communications are maintained in both directions. Terms including simplex, duplex, frequency division duplex, FDD, and time division duplex, TDD, are all methods that can be used. For cellular systems it is necessary that it is possible to talk or send data in both directions simultaneously, and this places a number of constraints on the schemes that may be used to control the transmission flow. As it is such a key element of the system, it is necessary to settle on the scheme that will be used from outset. As a result the duplex scheme to be used forms a very basic part of the overall specification for the cellular (or any radio communications system) that is to be used. The different schemes for controlling the transmission range from simplex through half duplex to full duplex. Furthermore, schemes such as TDD and FDD need to be defined for the system depending upon its application and the traffic it is likely to carry. Many aspects of the performance will be governed by aspects such as whether FDD or TDD is used."

The disclosures of all publications and patent documents mentioned in the specification, and of the publications and patent documents cited therein directly or indirectly, and of specifications of mentioned protocols are hereby incorporated by reference.

SUMMARY

Certain embodiments include an improved mobile and/or cellular and/or wireless communication system.

Certain embodiments seek to provide a tactical cellular relay, which, on the one hand is compatible with cellular communication standard, and, on the other, facilitates construction of a multi-layered distributed network. Certain embodiments separate the access communication between the end user and the base station, and the backhauling communication between the base station and other cores. Compatibility with client end equipment is typically provided. Certain embodiments provide a unified RF FE which will allow work in multiple bands and will support both FDD and TDD.

Certain embodiments seek to provide a relay with TDD software and FDD hardware.

Certain embodiments seek to provide a TDD/FDD network.

Certain embodiments seek to provide a front end card or board which may be deployed in a relay e.g. the relay of the published Giloh patent application mentioned herein.

Certain embodiments seek to provide a front end (aka FE) board aka unified FE card supporting plural signal separation technologies.

Certain embodiments seek to provide a front end card or board supporting both TDD and FDD which facilitates coping with strong interference occurring in part of the band.

It is appreciated that a network typically includes relay units working in close proximity Each unit has two channels of transmission/reception in the same frequency slice:
Access channel e.g. vis a vis LTE (say) subscriber
Backhauling channel e.g. vis a vis next LTE site.

This proximity of the channels in each relay and adjacent relays creates several mutual interferences e.g. the RBS's (base station functionality's) downlink channel, interfering with the RUE (or mobile station functionality); the RUE's uplink channel interfering with the RBS (or base station functionality); the RBS's (base station functionality's)

uplink channel interfering with adjacent relays; and the end units' uplink channel interfering with adjacent relays. Certain embodiments seek to reduce these interruptions to enable relays to function properly.

In a cellular system that combines hierarchical relays, which are sometimes carried back-in-band backhauling in dynamic topology, certain embodiments provide all or any subset of:

finding neighbors whose phase is the same as the phase of the interfering signal overcoming internal interference in the cellular relay between Access and Backhauling in TDD in any existing frame configuration.

management of relays in case of multi-hop hierarchies.

ability to increase coverage for cellular networks in places where reception is problematic, and the ability to increase network efficiency and capacity, without changing the standard protocols of the cellular network.

facilitates building networks and connections between relays. Expanding existing/new cellular network to support relays in general and multi-hop transmission in particular, to increase network coverage and/or increase network capacity and efficiency.

Can operate standalone in FDD and in all configurations in TDD as a network. It is appreciated that TDD has plural configuration e.g. (0-9) described inter alia here: niviuk.free.fr/lte_tdd.php.

easier to deal with Time Synchronization requirements cost effective (cheap)

BRIEF DESCRIPTION OF THE DRAWINGS

Certain embodiments of the present invention are illustrated in the following drawings.

Prior art

Figure 1:
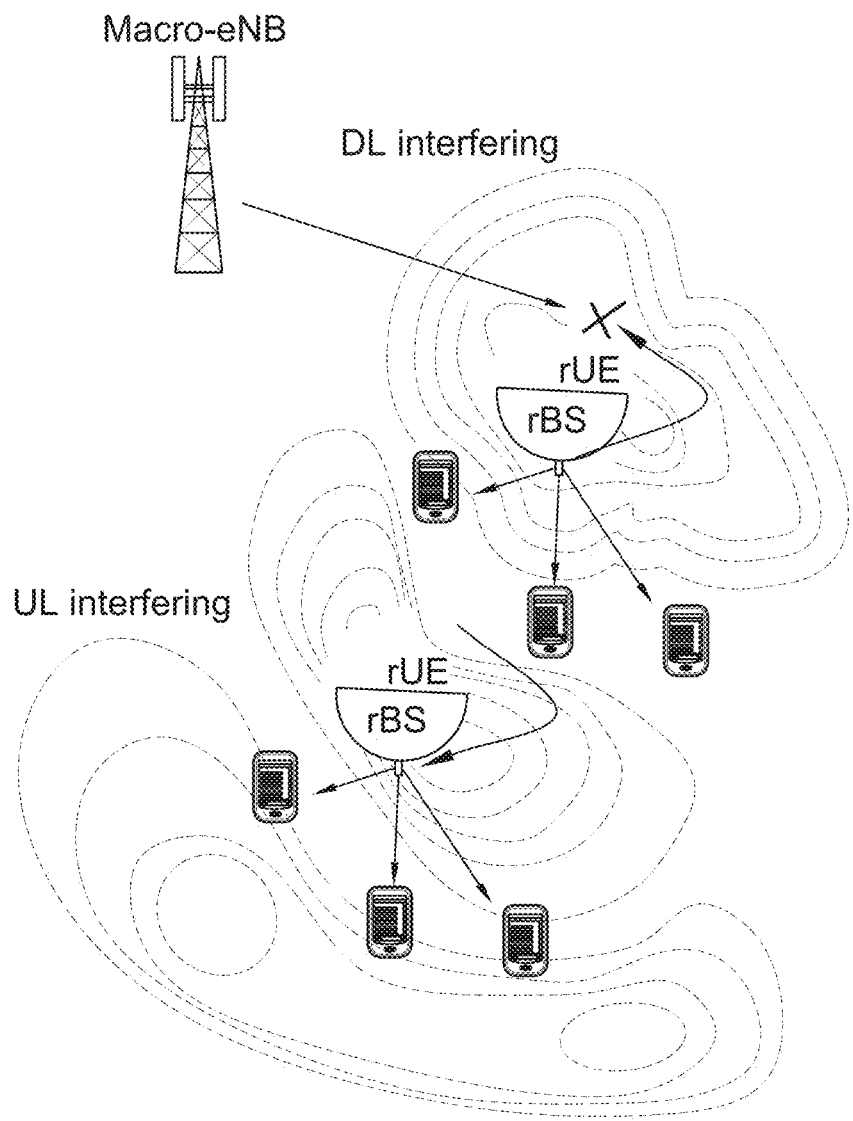
FIG. 1 is a diagram of an embodiment of the invention.

Prior art FIGS. 5-9 describe FDD and TDD technologies.

FIG. 10 is a simplified flowchart illustration of a method according to certain embodiments; all or any subset of the operations shown may be provided, in any suitable order e.g. as shown.

FIGS. 11-16 are schematic diagrams of embodiments of the invention.

Computational components described and illustrated herein can be implemented in various forms, for example, as hardware circuits, such as but not limited to custom VLSI circuits or gate arrays or programmable hardware devices such as but not limited to FPGAs, or as software program code stored on at least one intangible computer readable medium and executable by at least one processor, or any suitable combination thereof. A specific functional component may be formed by one particular sequence of software code, or by a plurality of such, which collectively act or behave or act as described herein with reference to the functional component in question. For example, the component may be distributed over several code sequences such as but not limited to objects, procedures, functions, routines and programs and may originate from several computer files which typically operate synergistically.

Data can be stored on one or more intangible computer readable media stored at one or more different locations, different network nodes or different storage devices at a single node or location.

It is appreciated that any computer data storage technology, including any type of storage or memory and any type of computer components and recording media that retain digital data used for computing for an interval of time, and any type of information retention technology, may be used to store the various data provided and employed herein. Suitable computer data storage or an information retention apparatus may include an apparatus which is primary, secondary, tertiary or off-line; which is of any type or level or amount or category of volatility, differentiation, mutability, accessibility, addressability, capacity, performance and energy use; and which is based on any suitable technologies such as semiconductor, magnetic, optical, paper and others.

DETAILED DESCRIPTION OF CERTAIN EMBODIMENTS

Certain embodiments provide a cellular network relay which supports operation in plural bands.

Any relay or multi-hop relay (aka hierarchical relay) herein may comprise any relay known in the art e.g. those described in any of the following co-pending patent documents, the disclosures of which are incorporated by reference:

Cellular Communication System with Moving Base Stations and Methods and Apparatus, Inventor: Benjamin Giloh,

| United States of America | 13/575,795 | 27 Jan. 2011 | US-2013-0059585 |
|---|---|---|---|

Various Routing Architectures for Dynamic Multi-Hop Backhauling Cellular Network and Various Methods, Inventors: Adi Schwartz, Gil Koffman, Yaakov Shoshan

| United States of America 20 Sep. 2016 | 13/989,589 20 Mar. 2020 | 23 Nov. 2011 | U.S. Pat. No. 9,451,476 |
|---|---|---|---|

Handover Initiation Methods and Systems for Improvement of Cellular Network Performance—Inventors: Adi Schwartz, Gil Koifman, Yaakov Shoshan

| United States of America | 13/989,663 | 23 Nov. 2011 | US-2013-0336289-A1 |
|---|---|---|---|

Various Traffic Management Methods for Dynamic Multi-Hop Backhauling Cellular Network and Systems . . . —Inventors: Adi Schwartz, Gil Koifman, Yaakov Shoshan

| United States of America | 13/989,693 |
|---|---|

Moving Cellular Communication System—Inventors: Jacob Tzlil, Yaakov Shoshan

| United States of America | 14/241,673 | 29 Aug. 2012 | U.S. Pat. No. 9,544,783 |
|---|---|---|---|
|  | PCT/IL2013/050116 | 2 Feb. 2013 | WO 2013/118123 |
| United States of America | 14/396,282 | 22 Apr. 2013 | US-2015-0351116-A1 |

Advanced Multi-Directional Relay Architecture and Apparatus and Methods of Operation . . . —Inventors: Adi Schwartz, Yaakov Shoshan

| Israel 221322 | 6 Aug. 2012 | 221322 | 30 Dec. 2016 |
|---|---|---|---|

Architecture and Methods for Traffic Management by Tunneling in Hierarchical Cellular Networks—Inventors: Adi Schwartz, Benjamin Giloh, Yaakov Shoshan

| United States of America | 13/989,666 | 23 Nov. 2011 | U.S. Pat. No. 9,351,173 |
|---|---|---|---|

Cellular Communication System Utilizing Upgraded Moving Relays And Methods . . . —Inventors: Adi Schwartz, Gil Koifman, Yaakov Shoshan

| United States of America | 14/004,222 | 8 Mar. 2012 | U.S. Pat. No. 9,369,941 |
|---|---|---|---|

An IP Based Cellular Communication System Utilizing Advanced Tunnels and Encapsulation Methods . . . —Inventor: Itay Sherman

| United States of America | 14/004,310 | 8 Mar. 2012 | US-2014-0071884 |
|---|---|---|---|

Moving Cellular Communication System Operative in an Emergency Mode—Inventors: Adi Schwartz, Itay Sherman, Udi Weinsberg, Yaakov Shoshan

| United States of America | 14/004,291 | 8 Mar. 2012 | U.S. Pat. No. 9,220,048 |
|---|---|---|---|

Apparatus and Methods for Cellular Network Communication Based On Plural Mobile Cores—Inventor: Adi Schwartz

| United States of America 1 Sep. 2016 | 15/029,657 | 19 Oct. 2014 | US-2016-0255667 |
|---|---|---|---|

A Multi-Directional Relay Architecture and Apparatus and Methods of Operation . . . —Inventors: Adi Schwartz, Yaakov Shoshan

| United States of America | 14/378,131 | 12 Feb. 2013 | US-2015-0016330 |
|---|---|---|---|

System and Methods for Null Steering in a Multicarrier System—Inventors: Gil Koifman, Yaakov Shoshan

| United States of America | 13/704,319 | 13 Jun. 2011 | U.S. Pat. No. 9,059,770 |
|---|---|---|---|

Add-On System and Methods for Spatial Suppression of Interference in Wireless Communication Networks—Inventors: Dov Wulich, Joseph Tabrikian, Shmuel Weisbart

| United States of America | 14/378,135 | 12 Feb. 2013 | US-2015-0004962-A1 |
|---|---|---|---|

Add-On Apparatus for Synchronization of Frequency Diversity Communications and Methods . . . —Inventors: Gil Koifman, Michael Elmakias, Yaakov Shoshan

| United States of America | 14/892,331 | 20 May 2014 | US-2016-0112114 A1 |
|---|---|---|---|

Add-on Apparatus for Channel Compensation of Frequency Diversity Communications and Methods . . . —Inventors: Gil Koifman, Yaakov Shoshan

| United States of America | 14/892,323 | 20 May 2014 | US2016/0099747 |
|---|---|---|---|

Receiver, System and Method for Frequency Diversity Communications Using Beacon and Methods . . . —Inventors: Gil Koifman, Michael Elmakias, Yaakov Shoshan

| United States of America | 14/891,493 | 20 May 2014 | US-2016-0119050 |
|---|---|---|---|

Partial Downlink Repeater Apparatus and Methods . . . —Inventors: Gil Koifman, Michael Elmakias, Yaakov Shoshan

| United States of America | 14/439,803 | 27 Oct. 2013 | US-2015-0270889-A1 |
|---|---|---|---|

System for Generating, Transmitting and Receiving Auxiliary Signals and Methods . . . —Inventors: Adi Schwartz, Yaakov Shoshan

| PCT/IL2016/050604 NP 10.12.17 | 9 Jun. 2016 | WO 2016/199144 | 15 Dec. 2016 |
|---|---|---|---|

For example, a relay may include base station functionality, a radio manager and mobile station functionality, all co-located, wherein each base station functionality is operative to communicate via antennae with at least one mobile station thereby to define a first radio link there between, and wherein each base station functionality has a physical connection to its co-located radio manager, wherein each mobile station functionality communicates via antennae with a unit which has base station functionality thereby to define a second radio link, wherein the radio manager in each individual moving relay comprises a radio resource manager, and functionality for exchanging information with radio managers included in moving relays other than said individual moving relay. Typically, said information is used by said radio resource manager to select, for at least one individual mobile station seeking to be served, one of a static base station and a base station functionality, to which to connect said individual mobile station in order to provide cellular communication services thereto.

For example, a relay may include a moving base station which communicates via antennae with the mobile stations and includes base station functionality, a first radio manager and mobile station functionality all co-located with the base station functionality, the base station functionality having a physical back-connection to the first radio manager, the first radio manager having a physical connection with the mobile station functionality, the mobile station functionality communicating via antennae with at least one selectable static base station, wherein the first radio manager comprises a radio resource manager; and functionality for receiving information from, and sending information to, other radio managers, respectively co-located with other moving base stations, and, typically, for using the information to determine whether to reject at least one mobile station seeking to be served by an individual base station associated with the individual co-located radio manager.

The at least one radio manager may be operative to compute, for at least one individual moving base station, route comparison information including a plurality of routes of base stations via which the individual moving base station can communicate with the core network and at least one parameter characterizing the relative quality of each of said routes and wherein said individual moving base station connects to a serving base station selected at least partly based on information indicative of said route comparison information.

A core device operative in conjunction with the relay may allocate constant communication session bandwidth between each mobile station functionality and the base station with which it is communicating so as to maintain a constant active mode of communication between each mobile station functionality and the base station.

Any relay or multi-hop relay (aka hierarchical relay) herein may comprise a base station functionality and co-located mobile station functionality and rRM as described e.g. in the co-pending patent documents described herein.

Both TDD—Time Division Duplexing and FDD—Frequency Division Duplexing, are used in wireless communication systems such as WLAN, WiMAX (fixed/mobile), and LTE. In TDD, uplink and downlink transmissions occur one after the other in time. Both uplink and downlink transmissions take place at a single RF carrier frequency (Fc). In FDD, transmitter and receiver operate at different carrier frequencies. Uplink and downlink transmissions may be assigned to separate carrier frequencies Fc1 and Fc2 respectively and both then transmit in the same time-slot. It is appreciated that communication from base station to user entities or transmission from LTE eNodeB to UEs are referred as downlink and communication in the opposite direction or transmission from UEs to eNodeB is referred to as uplink, where an LTE base station is referred to as eNodeB and its mobile subscriber is termed UE. State of the art LTE systems utilize TDD as well as FDD frame structures to allow user entities to benefit from both methods for sharing time and frequency among mobile subscribers or terminals, e.g. on a need-to basis. Ericsson, Altair semiconductor, Qualcomm and other manufacturers provide chips which support both versions, TDD and FDD, of LTE. For example, in LTE FDD a pair of frequencies is allocated to the uplink and downlink directions e.g. an uplink frequency allocated from a band or range 777 to 787 MHz and downlink frequency allocated from a band or range 746 to 756 MHz. LTE has a 10 ms radio frame including 10 sub-frames each with two slots each of 0.5 ms duration. There are thus 20 slots in a radio frame. The entire radio frame may be used simultaneously over downlink and uplink directions.

Certain embodiments provide an RF FE (radio frequency front end) or relay which supports operation in plural bands and supports operation in both FDD and TDD. This RF RE is advantageous particularly in use-cases which involve in-band backhauling for dynamic topologies, because the apparatus is characterized by all or any subset of the following:

allows the relay to find neighboring relays which are in the same phase as the phase of the interfering signal; and/or copes with internal interference between the relay's own access and the relay's own backhauling, when operating in TDD and/or allows a cellular network to extend its coverage in areas with poor cellular coverage; and/or does not require a new cellular network protocol, and can use conventional cellular network protocols such as but not limited to LTE.

FIG. 1 shows moving relays, such as Elta TacMAN relays or such as the relays described in co-pending Elta published patent applications e.g. as described herein, which typically operate in LTE and operate relatively close to one another, geographically. The relays operate "under" a base station or eNB, typically stationary, also termed herein the "macro-eNB". Each relay includes an MSF, aka mobile station functionality aka rUE and a co-located rBS (or base station functionality) aka BSF aka base station functionality, where each BSF serves plural mobile units, aka user entities or UEs. each relay has a Tx channel and an Rx channel, both in the same frequency band or slice. The channels used by a relay R include an access channel vis a vis the user entities being served by R's BSF, and a backhaul channel between R's MSF and a 'next hop' relay which is closer to the LTE network's core than R is. The relays are close enough together geographically to yield mutual interferences: between at least some of the following: the DL channel of the rBS (or base station functionality) interferes with the operation of the rUE (or mobile station functionality), the UL channel of the rUE (or mobile station functionality) interferes with the operation of the BSF, the UL channel of the BSF of relay R interferes with the operation of relays in R's geographical vicinity, and the UL of relay r's mobile stations aka user entities, interferes with the mobile entities served by relays in R's geographical vicinity. Certain embodiments seek to reduce these mutual interferences, thereby to facilitate each relay's operation and service to its respective user entities.

Each moving relay in FIG. 1 typically comprises a low power, broadband communications and information system that may be carried by a single person or mounted on a vehicles or other platforms. Each relay typically includes an LTE/4G base station, an LTE network core and an applications server that can run multiple applications. The relay typically can work alone as an independent network, or connect with other relays to create a multi-relay, multi-hop On-The-Move aka OTM broadband network.

The relay typically has versatile relay and backhauling capabilities as well as the ability to deploy a complete array of local services.

The relay typically has one or more of:
Stand Alone mode—On-the-Move stand-alone network supporting broadband applications which may for example include one or more of: real-time video, video conference, photos, MMS/SMS, PTT, VoIP, BMS.
Mesh Network Mode—Using the moving relay in FIG. 1 as part of a network of multiple moving relay nodes creating a larger area network with greater capacity and coverage. The moving relay in FIG. 1 typically uses an LTE based connection between the nodes as well as to the users. The moving relay in FIG. 1 can also be connected to other networks e.g. through LTE, SAT- COM, LOS or other IP radios. The users of the moving relay in FIG. 1 can also work through commercial 3G/4G cellular networks.

The moving relay in FIG. 1 may have some or all of the following specifications:
   Air Interface—3GPP LTE frequency bands 7, 13 (additional bands can be supported)
   Protocol—3GPP LTE release 8/9. FDD and TDD
   Carrier—Single carrier, 5, 10, 20 MHz BW
   Application server:
      Processor: Intel Core i7-3517UE
      DRAM: Up to 8 GB
      SSD: 128 GB
   Built in GPS
   I/O: one or more of: Gigabit Ethernet, 3×USB 2.0, 1×RS232, 1×HDMI, 4×LTE antenna connectors, GPS connector
   Power connector & ON/OFF switches
      Transmit power—2×1 W MIMO (expandable with external front end (FE)
      Power consumption—<60 W
      Transmit power: up to 20 W (with external front end aka FE)
      Power consumption—<160 W (including front end aka FE), 20-30 VDC As shown, the relay of FIG. 1 has TDD switch control. www.thinksmallcell.com provides the following information regarding TDD mode:

"Mobile networks have traditionally operated with separate frequencies used for the base station to transmit and for the smartphone/mobile device to transmit on. These paired frequencies, also called carriers, can be narrow (200 kHz for 2G GSM) or wide (5 MHz for 3G WCDMA). By contrast, TDD (Time Division Duplex) shares the same single carrier frequency and alternates the transmission between sender and receiver. Both 3G and 4G/LTE have TDD modes of operation . . . TD-LTE (is) the TDD mode for LTE . . . TDD mode is used in many other wireless communication standards, the most common of which is Wi-Fi—the IEEE 802.11 standard—used in millions of homes and offices worldwide. Two major benefits of TDD mode are:
a) That it can fit into any single spare piece of spectrum. Since it does not require a paired spectrum, this opens up previously unavailable frequencies.
b) Since the proportion of time spent sending or receiving can be varied, this allows the system to spend more time downloading than uploading. This makes it much more suitable for data traffic than voice, because data is normally highly asymmetric—most of the usage is viewing content from websites, or in the cloud.
TD-LTE shares the same system architecture and protocols as the normal LTE standard. It is only the Layer 1 (Physical Layer) which differs. The same software stacks, applications and call processing all apply . . . . For small cell designers, the work involved to design and build a TDD mode variant would require a slightly different physical component layout—specifically the hardware front end. Timing and synchronisation parameters are strict—phase synchronisation is needed to avoid interference."

Typically, communication via the relays in FIG. 1 includes access communication occurring between an end user's UE and a base station serving the user's UE (aka MS aka mobile station aka user entity). Other communication via the relays in FIG. 1, typically, is backhauling communication, occurring between the base station and other core/s. In wireless backhaul, wireless communications systems get data from an end user to a node in the Internet or any other agency network. Access networks connect to the end user and typically have a lower rate per link, and many end-points e.g. thousands, tens of thousands or more. Access networks may, for example, have a star configuration.

In FIG. 1, each relay provides an access channel vis a vis end users' mobile stations (or relays which are further from the core), and a backhauling channel vis a vis a node higher up in the cell network such as a relay which is closer to the core. These two channels, within a single relay, cause internal interference. Relays also generate external interference for each other. The UL channel of UEs served by relays also generate interference (and suffer from interference).

Figure 2:
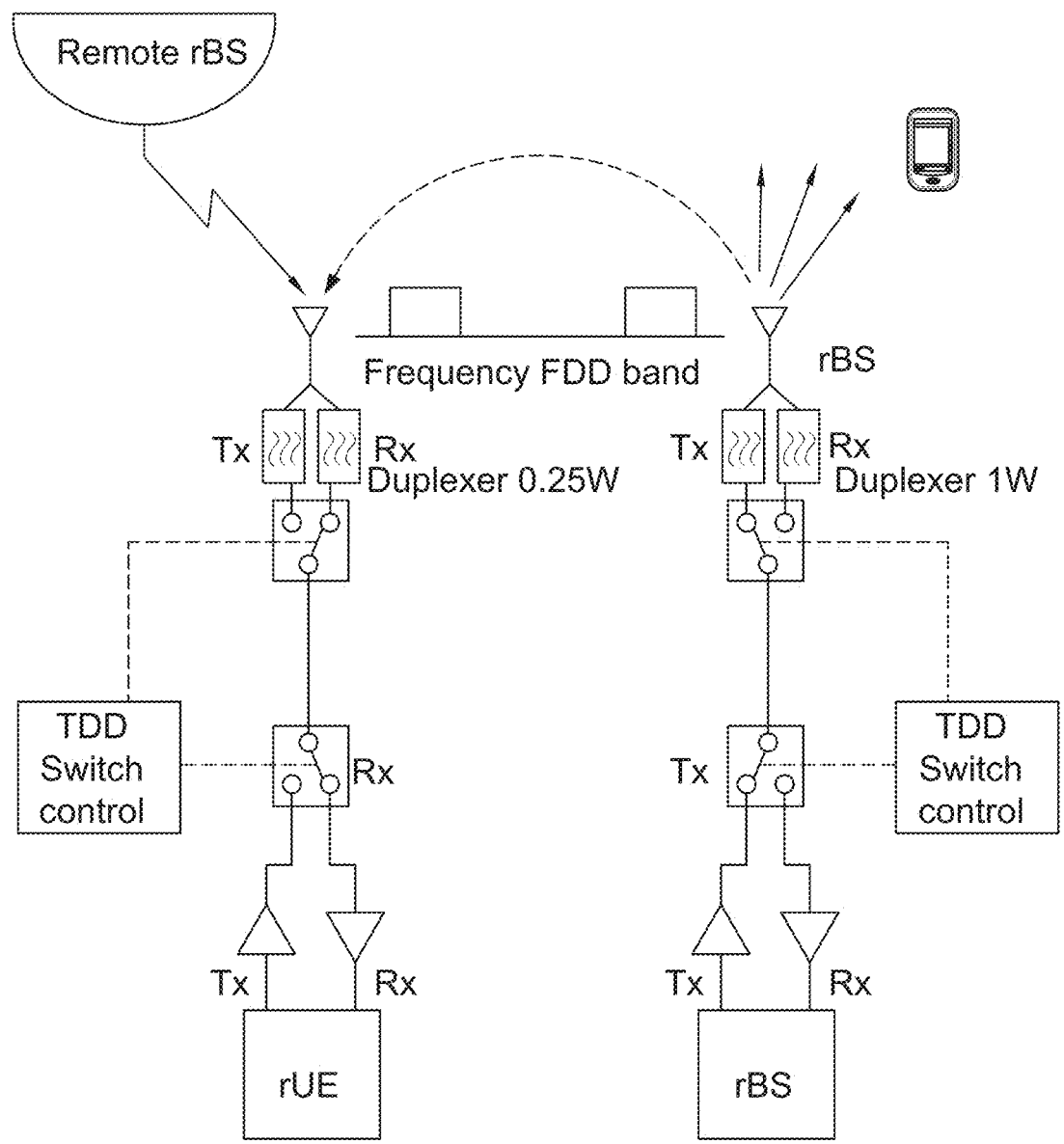
FIG. 2 is a simplified diagram of architecture that may be used to work in TDD (in any configuration), in an FDD frequency region.
Figure 3:
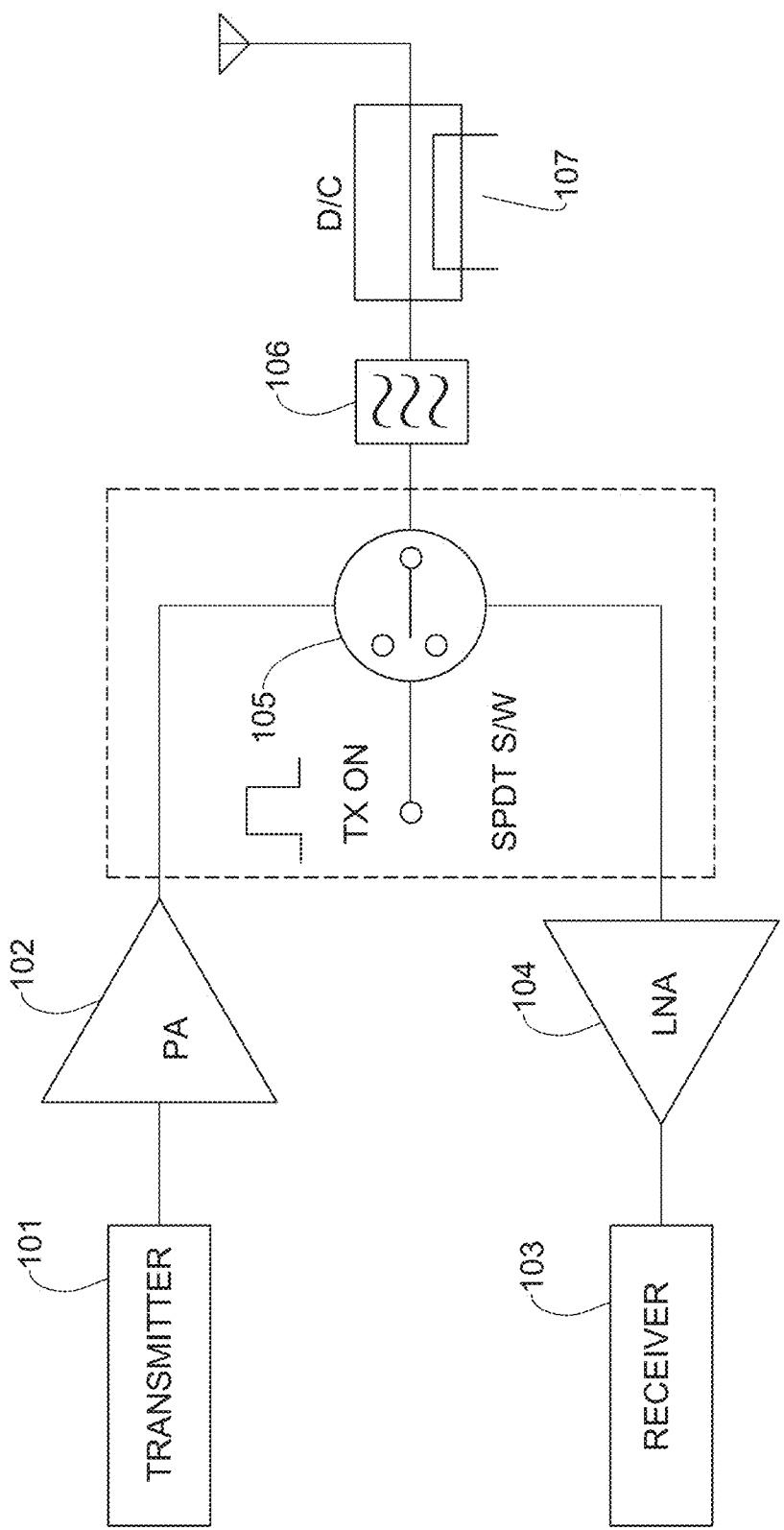
FIGS. 3-4 illustrate a conventional TDD radio frequency chain or flow.
Figure 4:
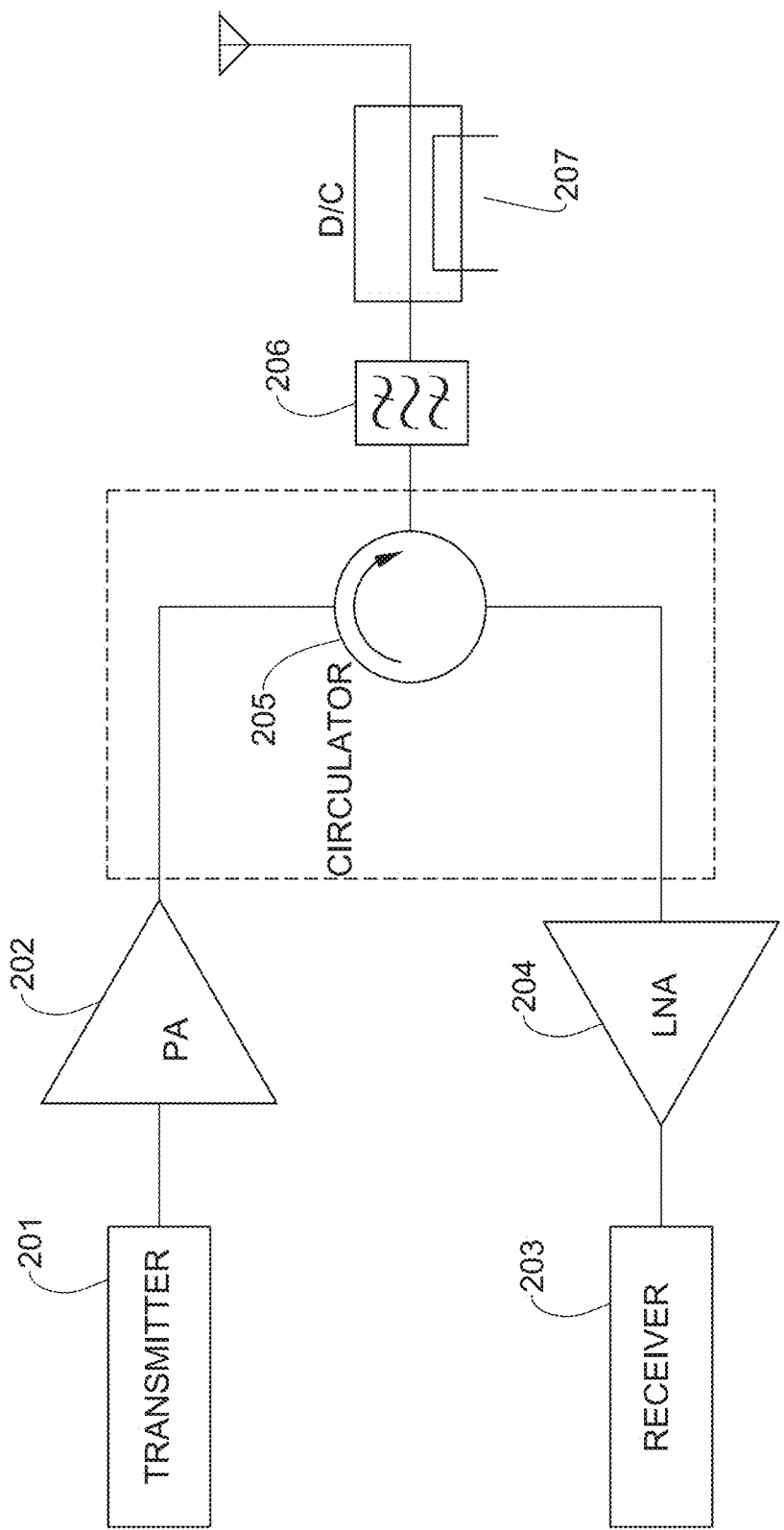
Figure 5:
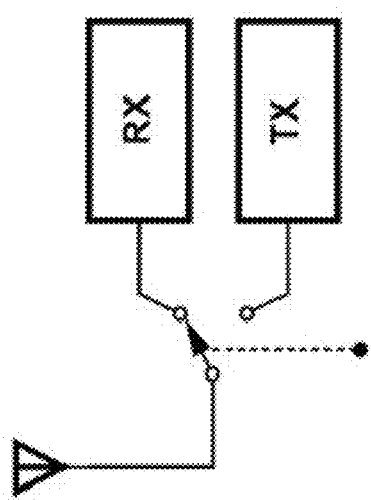
Figure 6:
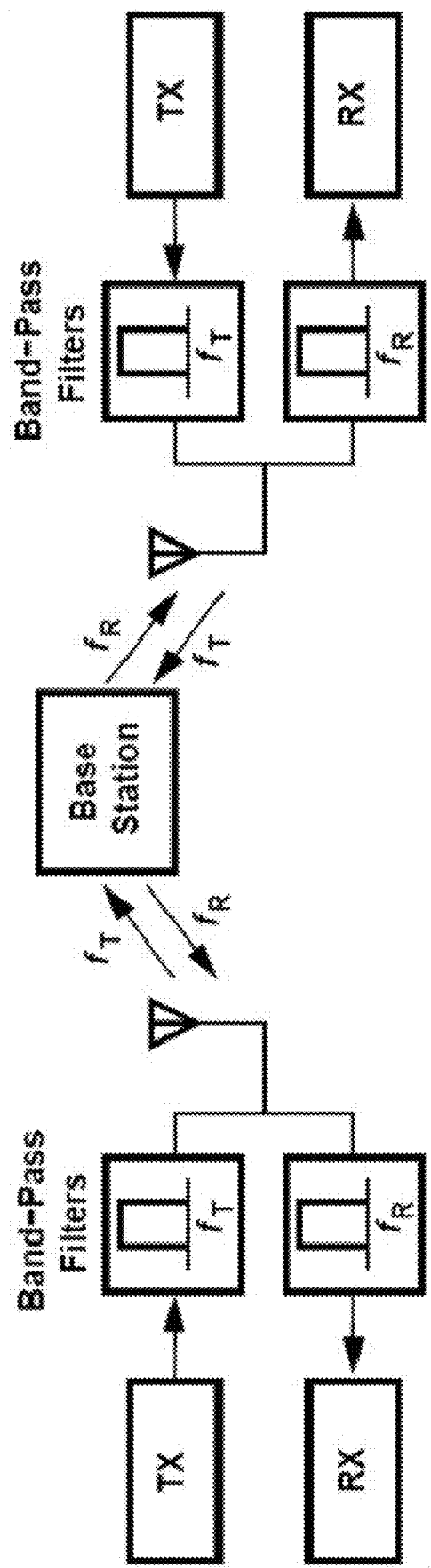
Figure 7:
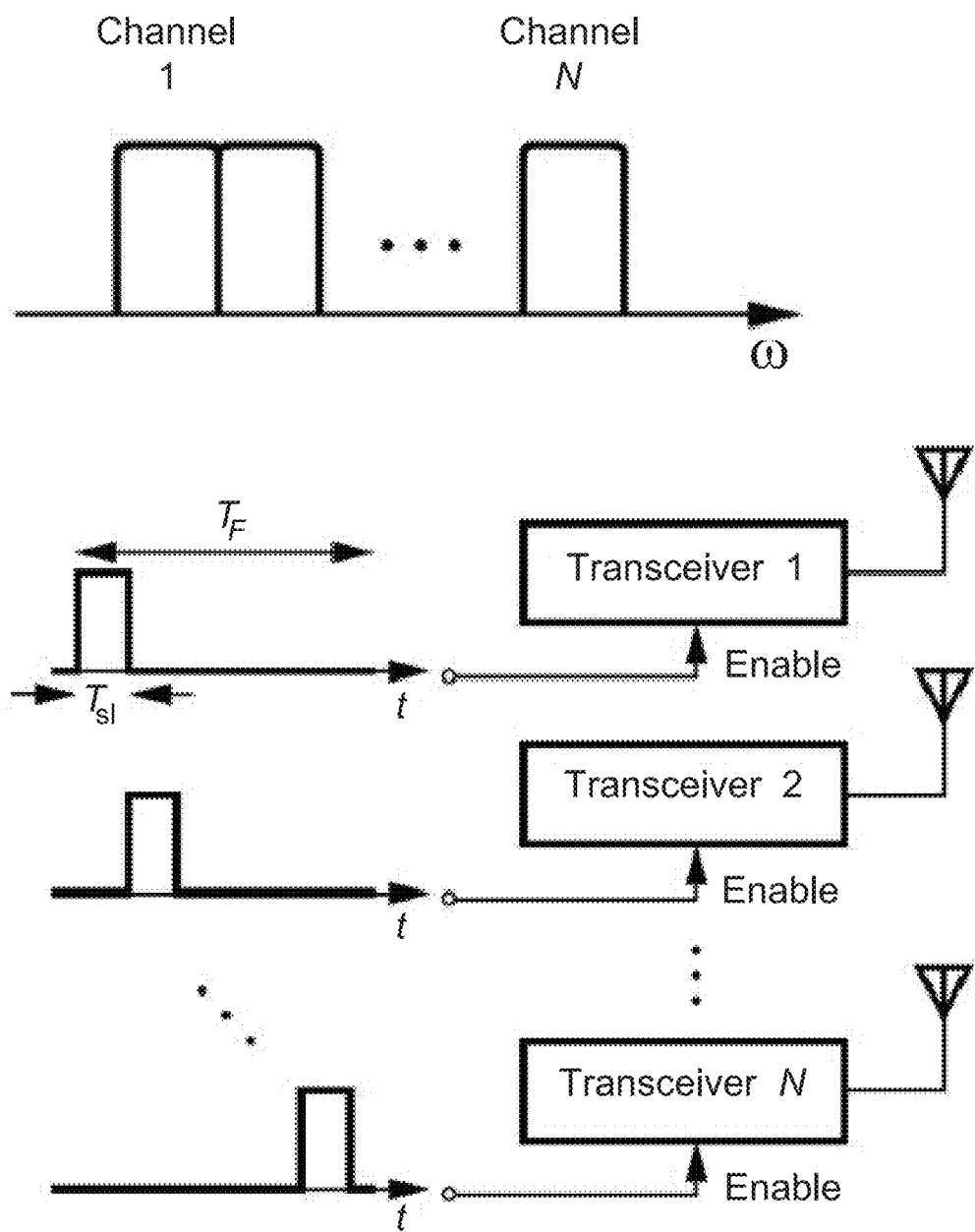

FIG. 2 shows an improved relay which may be used to implement any of the relays in FIG. 1. The relay includes co-located MSF and BSF, where the BSF serves user entities of which, for simplicity, only one is shown, and the MSF is served by a remote rBS base station functionality (or by a macro-eNB). Other than as described herein, each relay may be as described in the following co-owned PCT patent document: WO/2011/092698 to Gilo whose disclosure is hereby incorporated by reference in its entirety. It is appreciated that in FIG. 2, as shown in the graph, the uplink and downlink each have their own frequency bands and typically, there is a fixed separation between the uplink and downlink sub-bands aka frequency offset e.g. 100 MHz or any other suitable value such as 50 MHz or 200 MHz thereby allowing uplink and downlink communications to occur simultaneously in time, such that reception can occur over the downlink and simultaneously, transmission can occur over the uplink. Typically, FDD technology is used to divide the band in which the relay operates, into an uplink and downlink sub-band, each of which may be 5 MHz (megahertz). The MSF operates in the uplink allocation, and the co-located BSF operates in the downlink allocation and there is no mutual interference because TDD technology is used by both MSF and BSF such that the BSF and MSF need not be synchronized in time. An advantage is that due to utilization of frequency-division duplexing, the relays do not interfere with one another as they transmit and receive in different sub-bands. It is therefore not needed to maintain guard times between neighboring base stations, or to synchronize base stations to transmit and receive synchronously.

Typically the relay of FIG. 2 is operative to perform the method of FIG. 10; the method of FIG. 10 which may alternatively be performed by any other suitable system, may include all or any subset of the following operations, suitably ordered e.g. as shown:
   1. relay base station=BSF is starting up (e.g. system-up process)
   2. the BSF's co-located rMS (aka MSF, aka rUE) is searching for a remote eNB or base station (in Rx and Tx sub-bands), typically first searching the Rx sub-band and then the Tx sub-band.
   For this purpose, the relay controller may be operative to switch each sub-band. (e.g. the top-left and top-right switches in FIG. 2 or Tx/Rx duplexer)
   3. rMS (or mobile station functionality) connects to one of the available eNBs or base stations (now we have the backhauling sub-band)
   4. after that, rMS (or mobile station functionality) connects to one of the neighboring cell) its collocated eNB or base station starts up on the other sub-band EARFCN (access sub-band).

5. rMS (or mobile station functionality) measures other neighboring eNBs that are on its backhauling sub-band, or all the eNB in the bands when the eNB or base station is not transmitting.

During these measurements, rMS (or mobile station functionality) does not hear the interference of the eNB or base station because the rMS (or mobile station functionality) is in another sub-band.

As long as rMS (or mobile station functionality) is working in one frequency sub-band (backhauling sub-band e.g.) and rBS (or base station functionality) is working in the second frequency sub-band then there is no interference between the co-located rMS (or mobile station functionality) and rBS (or base station functionality) in FIG. 2.

It is appreciated that LTE EARFCN aka Evolved-UTRA Absolute Radio Frequency channel numbers are typically LTE carrier channel numbers, which may be used in LTE networks to define a particular carrier frequency and do not take into account the channel bandwidth. EARFCN may define a unique centre frequency for a carrier e.g. an LTE carrier frequency. A centre frequency of a carrier may be computed using the EARFCN number. The computation for downlink and uplink carriers is typically different. Typically the EARFCN reflects the center frequency of an LTE carrier (e.g. 1.4/3/5/10/15/20 MHz carriers) without taking channel bandwidth into account. Using the specification of 3GPP TS36.101 (say) then for a downlink carrier, $F_{DL}=F_{DL\_low}+0.1(N_{DL}-N_{Offs-DL})$, where $F_{DL}$ is the center frequency to be computed, given input parameters $F_{DL\_low}$, $N_{DL}$, and $N_{Offs-DL}$ where $F_{DL\_low}$ is the lowest allowed center frequency for the downlink, $N_{DL}$ is the EARFCN value to be plugged into the equation, and $N_{Offs-DL}$ is the lowest defined EARFCN for the band. TS36.101 may comprise tables of values for $F_{DL\_low}$, $N_{DL}$, and $N_{Offs-DL}$ for various operating bands. For band 3, say, $F_{DL\_low}$ is 1805 MHz (downlink center frequency runs from 1805 to 1880 MHz for this band), and the allowed range of $N_{DL}$ is 1200 to 1949, hence $N_{Offs-DL}$ is 1200, the lowest defined EARFCN for the band. Thus for EARFCN=1350, with $F_{DL\_low}$=1805 MHz, and $N_{Offs-DL}$=1200, $F_{DL}$==1820 MHz.

Typically the switches in FIG. 2 switch from the Rx channel of the duplexer to the Tx channel of the duplexer, and back.

Each switch may switch from the Rx/Tx side and vice versa, depending on which band needs to work during transmission.

It is appreciated that any suitable technology may be employed to implement the duplexers of FIG. 2. Notch duplexers or bandpass duplexers may be employed, for example. A duplexer may comprise two band pass filters, e.g. for Tx\Rx. Typically, each duplexer supports bi-directional (duplex) radio communication. Typically, the duplexer isolates the receiver from the transmitter which shares the same antenna. Each duplexer may be based on frequency (e.g. a waveguide filter), and/or polarization (e.g. an orthomode transducer), and/or timing. In radio communications, transmitted and received signals can occupy different frequency bands, hence may be separated by frequency-selective filters. High and low frequency signals travel in opposite directions at the shared port of the duplexer. A duplexer is typically designed for operation in the frequency band used by the receiver and transmitter in question, and for handling the output power of the transmitter in question. Each duplexer typically provides adequate rejection of transmitter noise occurring at the receive frequency, and operates at the frequency separation between the transmitter and receiver, or less than that frequency separation.

According to certain embodiments, each channel (backhaul, access) is allocated its own frequency. According to certain embodiments, when information is received by relay R from neighboring relays and/or from the user entities that R serves, all channels, in R, are silent i.e. no channels, in R, are used to transmit.

Any suitable algorithm for the switch control in FIG. 2 may be employed. Generally any suitable algorithm may be employed by any node, to determine to whom to connect. For example, a graph or tree may be built, where each relay is a node in the graph, and any suitable method, e.g. Dijkstra's algorithm, may be used or finding the shortest paths between nodes in a graph, hence for deciding how to traverse the tree.

It is appreciated that two or three (say) Tx\RX switches, each comprising a conventional TDD RF chain switch, may be provided, where switch is used herein as a logic term, and can be implemented in any suitable technology.

Two of these Tx\Rx switches are operative for switching between the Tx (Transmit) RF chain and Rx (Receive) RF chain. Typically, the first layer or L1 in an eNB/UE is operative to switch the eNB or base station from Rx mode to Tx mode. The UE (or mobile station) is synchronized to the eNB or base station, so when the eNB or base station is in Rx mode, the UE (or mobile station) is in Tx mode, and vice versa: when the eNB or base station is in Tx mode, the UE (or mobile station) is in Rx mode. The third switch may be as described and illustrated herein.

Still referring to FIG. 2, it is appreciated that the relay on the access side of the base station may transmit and receive on one side (say, the Rx side) of the FDD duplexer in TDD technology, thus utilizing the strong separation of the duplexer. For the backhauling channel, the same relay may use another duplexer on the other side (e.g. on the Tx side). If the relay operates in FDD, the base station may use both sides of the duplexer.

Typically, TDD switch control logic is provided to enable the switch to decide when to Tx and when to Rx e.g. in the HW.

It is appreciated that layer 1 is responsible for Tx\Rx (transmit/receive) timing.

Typically, the eNB or base station includes a CPU with an operating system on which the eNB or base station process (whether FDD or TDD or other) runs. For the relay there is software that manages the rMS (or mobile station functionality) side and/or the EARFCN that the eNB or base station uses; this software may reside on an additional CPU+ Memory.

It is appreciated that in conventional systems, the TDD modem outputs to the antenna, whereas according to certain embodiments, the TDD modem outputs to the duplexer.

According to certain embodiments, the PHY layer is oblivious to the fact that the hardware is flexible dual mode, due to the hardware design shown and described herein.

A particular advantage of embodiments herein e.g. the embodiment of FIG. 2, is that a moving cellular network may be constructed in all TDD configurations in a given band.

Another particular advantage of embodiments herein e.g. the embodiment of FIG. 2, is that a unified or single electronic board may be provided for plural separation techniques e.g. for both TDD and FDD.

Figure 9:
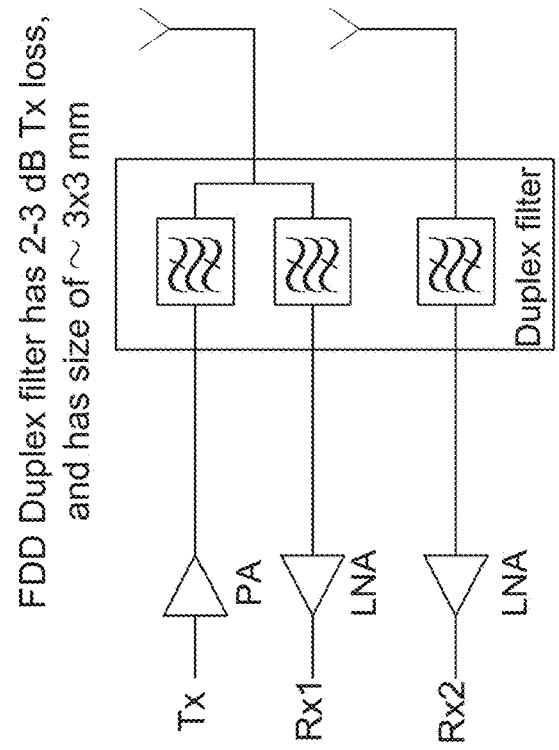
Figure 8:
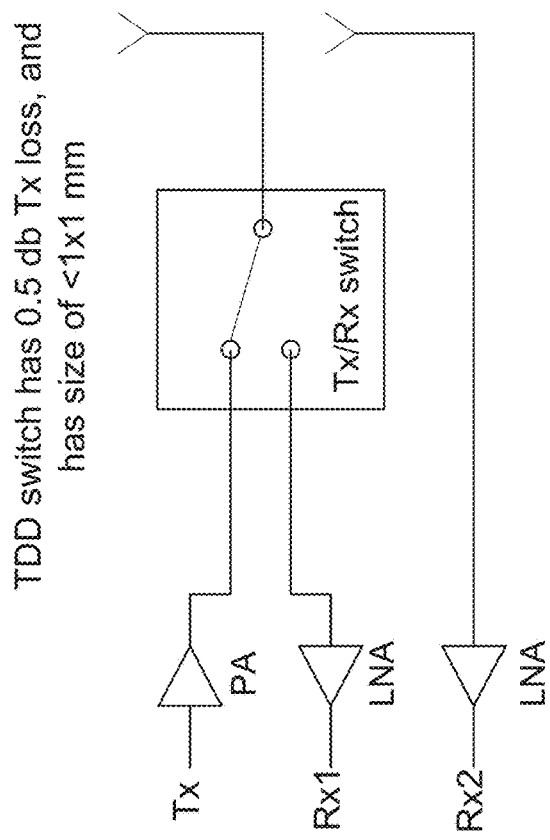

FIG. 8 illustrates a TDD RF CHAIN in which typically, the device can send and receive on the same sub-band, but not at the same time. In contrast, FIG. 9 is an FDD RF chain, where the device can send and receive data at the same time, but not on the same sub-band. According to certain embodiments, a combination of the embodiments of FIGS. 8 and 9 is used, such that the device can send and receive in both access and backhauling in TDD, where both RF chains are combined.

Typically, duplexing includes transmitting and receiving voice/data simultaneously. For example, a TDD system typically receives data for, say, the first half of the frame, then transmits data for the remaining portion of the frame, typically uses the same frequency for both Rx and Tx, typically uses time to duplex, and typically uses a T/R switch that may be integrated into the RF front end. An FDD system typically transmits and receives continuously and simultaneously, typically transmits data in a given frequency band, and typically receives data on different frequencies which fall outside the given band, and typically requires a lossy duplex filter to protect the sensitive receiver from Tx noise.

Prior art source: www.slideshare.net/darcypoulin/tdd-versus-fdd (slide 7) points out that it is "very difficult to integrate the duplexer into an RF front end".

Figure 11:
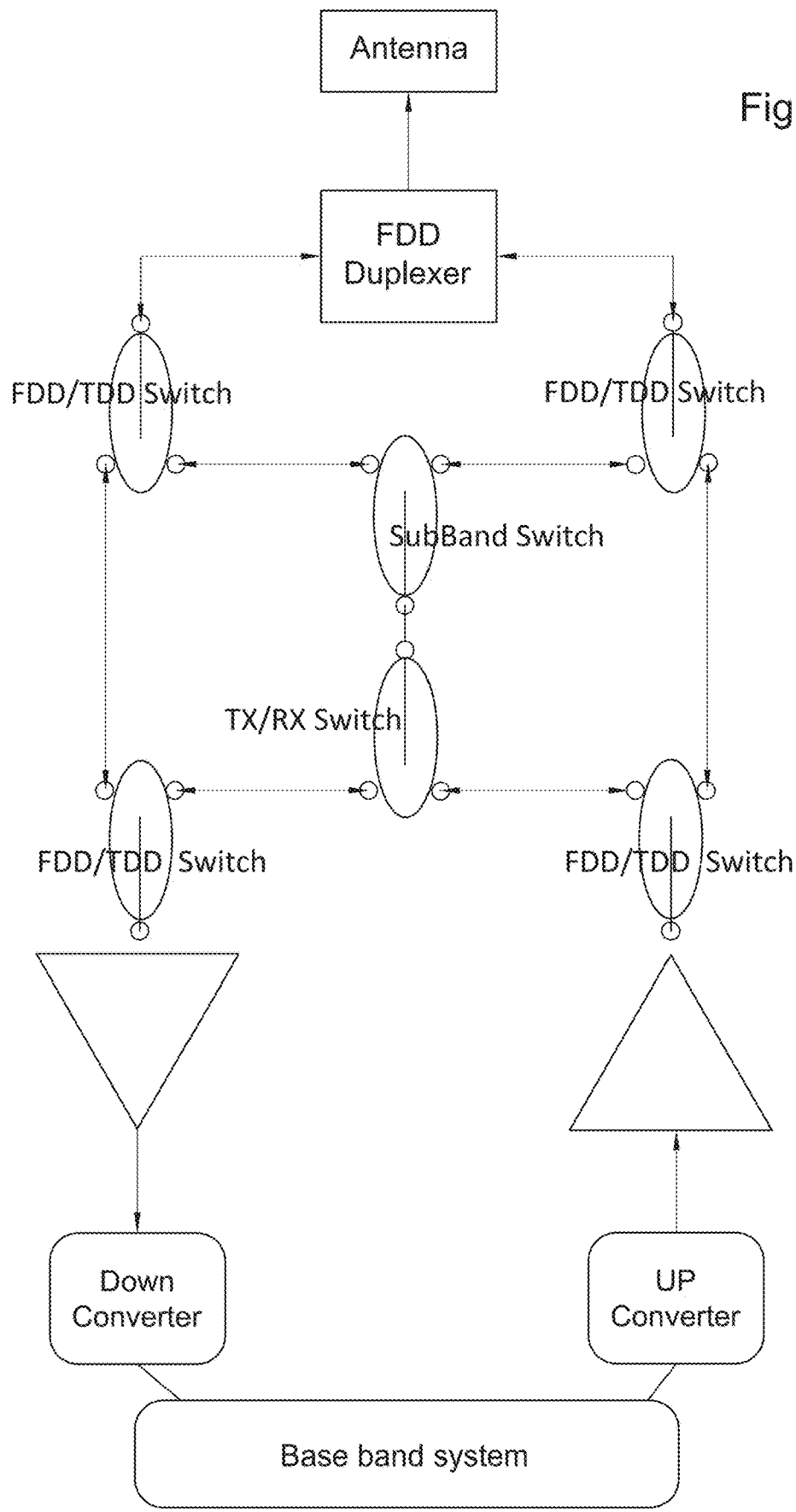

FIG. 11 is a schematic illustration of an RF front end typically supporting both TDD and FDD.

In the case of FDD, the UL and DL frequencies are typically different: for UL, the signal comes from the antenna to the duplexer, and in the duplexer the signal is typically received in the Rx side of the duplexer (shown on the left in FIG. 11). In FDD, the FDD/TDD switch typically goes to another switch that typically maps directly to the low-noise amplifier (LNA) that goes typically to the down converter. The low-noise amplifier (LNA), DDC and duplexer may form a conventional FDD RF chain. The DL, RF signal is typically sent from the baseband processor to the PA or power amplifier on the right. Typically, the two switches are in FDD mode, so the signal is transferred directly to the Tx side of the duplexer.

In the TDD case, the system typically switches between Tx\Rx time on the same frequency. The frequency can be any frequency in the band, e.g. including Tx and Rx frequency. The sub-band switch is typically operative to switch between the Tx and Rx sides of the duplexer to determine which side is to be used in current mode. In the TDD case: for UL, the signal comes from the antenna to the duplexer and the duplexer typically splits the frequency to the Rx\Tx side. For Tx or Rx the signal typically goes to the FDD\TDD switch on the Left\Right side. From there the signal typically continues to the sub-band switch which is typically operative for mapping between a current working sub-band to the Rx\Tx portion of the RF chain. From there, the signal typically continues to the Rx\Tx switch that is now in Rx mode. The Rx\Tx typically switches to the low-noise amplifier (LNA), down converter and Rx side of the base-band. In TDD Tx mode, the TDD\FDD switch is typically on TDD mode, the signal goes typically to the TX\Rx switch, then typically to the sub-band switch, then typically to the TX or RX side of the duplexer, and then typically to the antenna.

Figure 12:
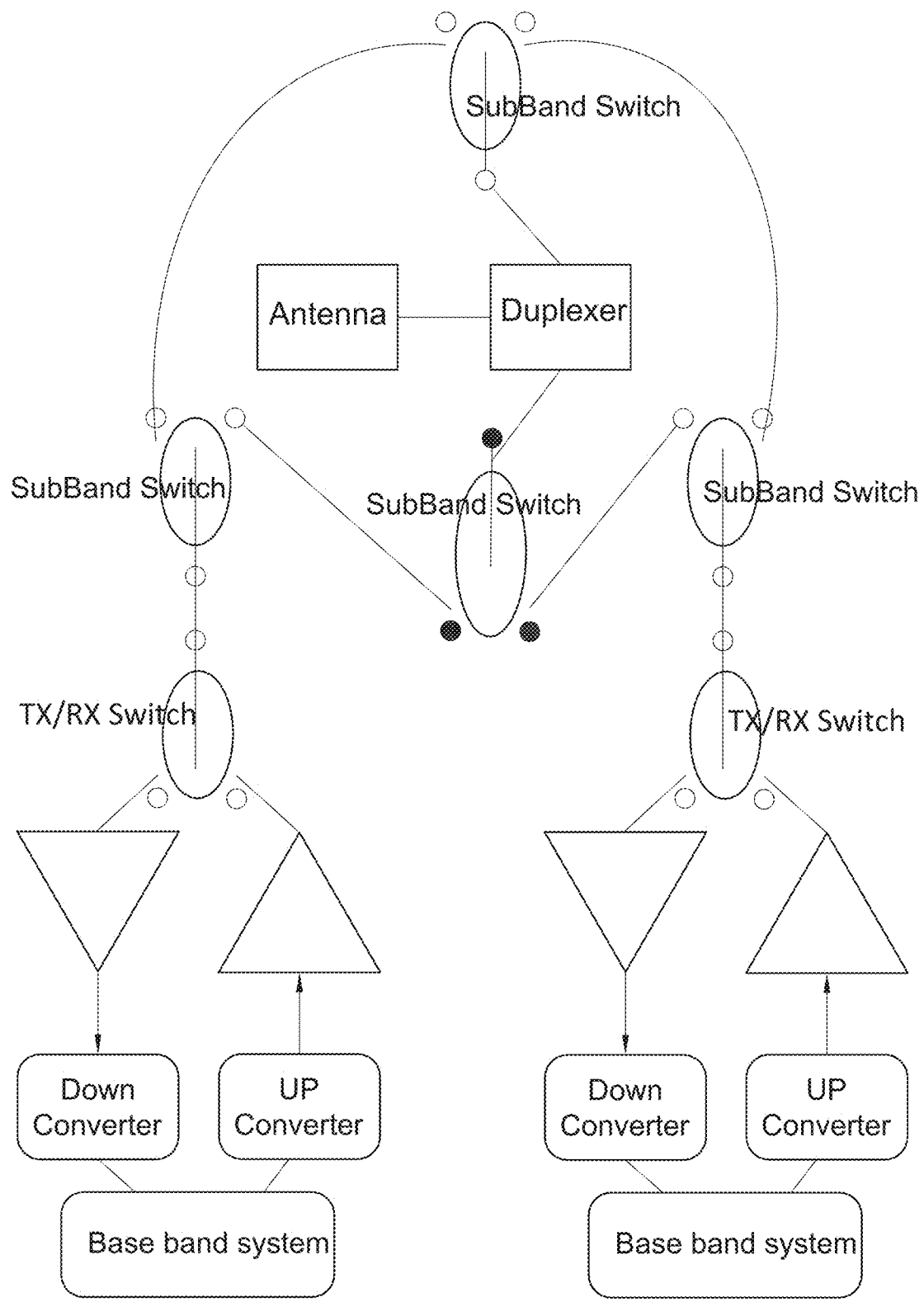

FIG. 12 shows two RF devices using a single RF front end, in TDD mode. The two RF devices enjoy excellent separation, and typically can work in the same TDD band (in different sub-bands), due the duplexer. One device may for example be a relay's rMS (or mobile station functionality), and the other may for example be a relay's rBs (or base station functionality).

Figure 13:
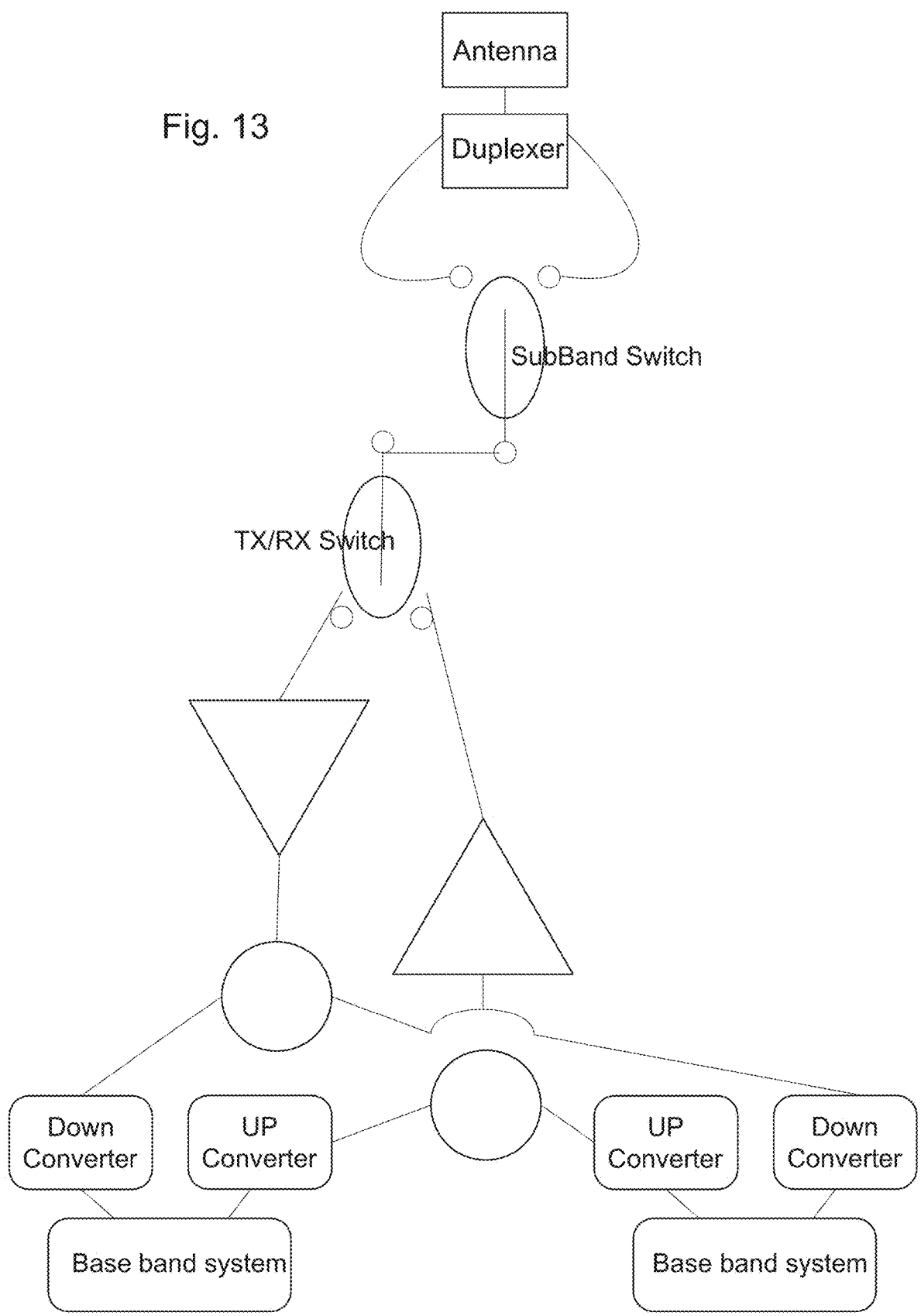

FIG. 13 illustrates another solution for using a single RF front end for two different devices by using a coupler.

Figure 14:
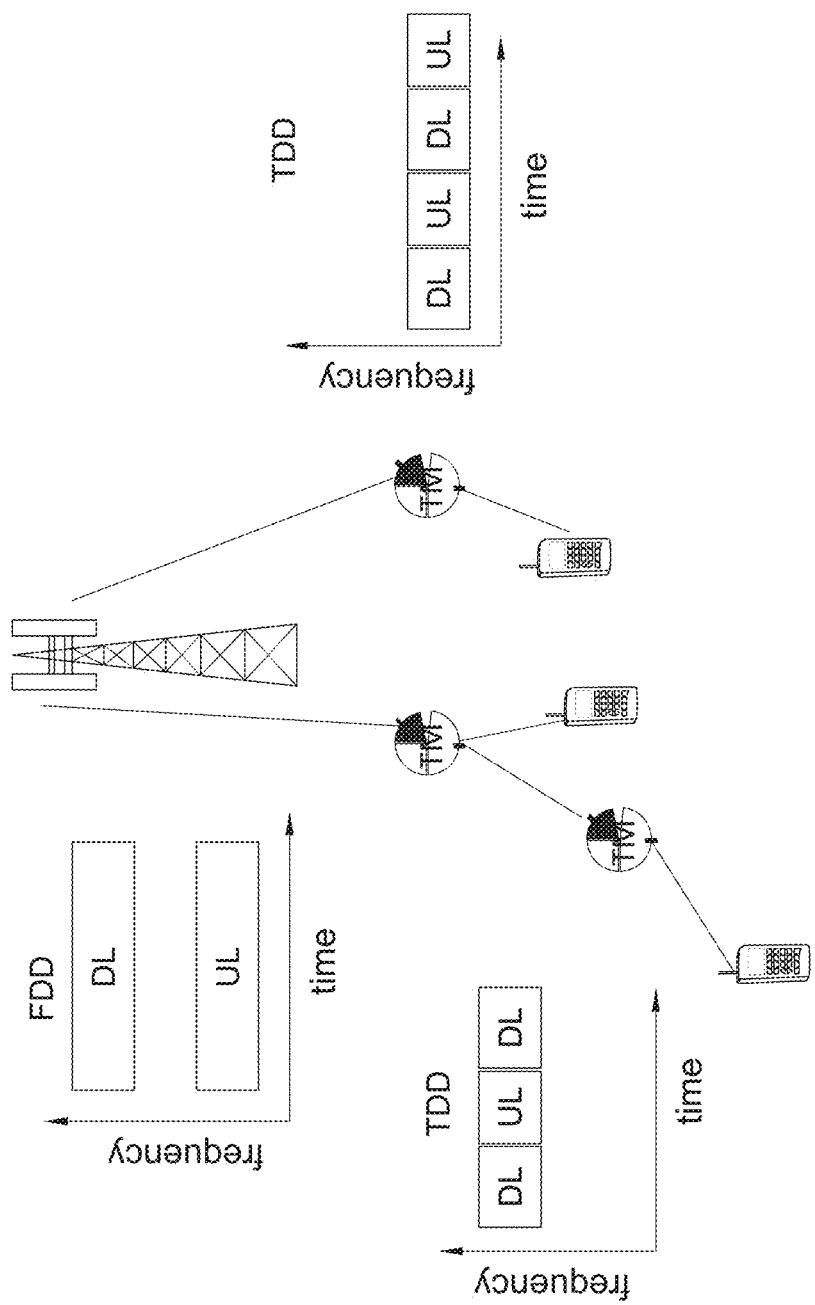

FIG. 14 is an example of how the RF front end may be used in a relay system. The top most system is a conventional, typically commercial system with FDD macro base stations deployed. A first layer relay system is typically connected to the FDD macro, e.g. using the rMS (or mobile station functionality) of the TM. The rBS (or base station functionality) typically uses the lower portion of the band, the Tx sub-band. When the rMS (or mobile station functionality) is transmitting, the rBS (or base station functionality) may not be able to receive, because the two are on the same sub-band so the rMS (or mobile station functionality) and rBS (or base station functionality) Rx timing may be synchronized. The second layer is typically another relay, whose rMS is connected to the first layer which is transmitting TDD signals. The second layer uses the DL portion of the sub-band. The first and second layers need not be time-synchronized, as they are in different sub-bands, and are isolated by the duplexer.

Figure 15:
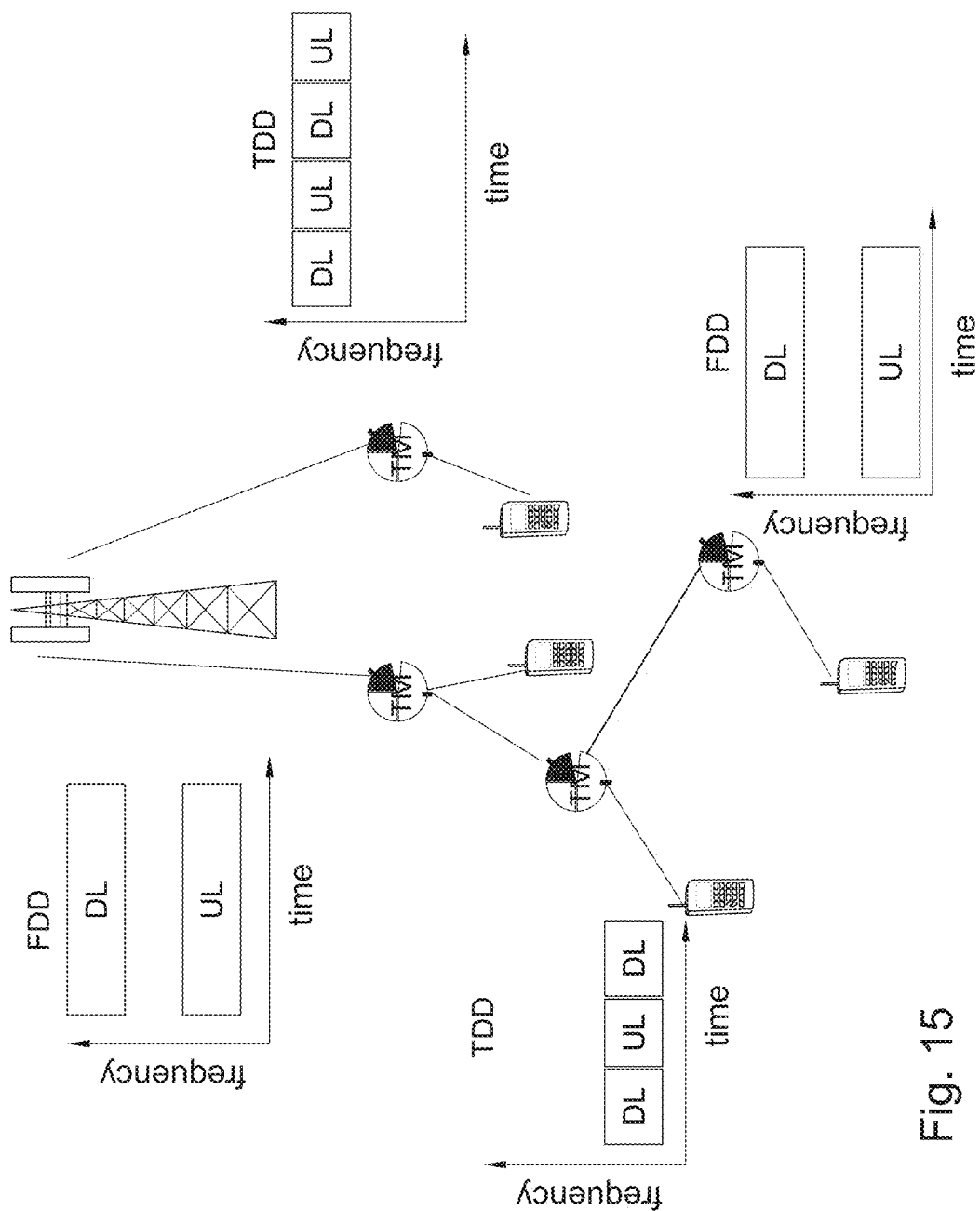

FIG. 15 is an example of how the RF front end may be used in a relay system.

Figure 16:
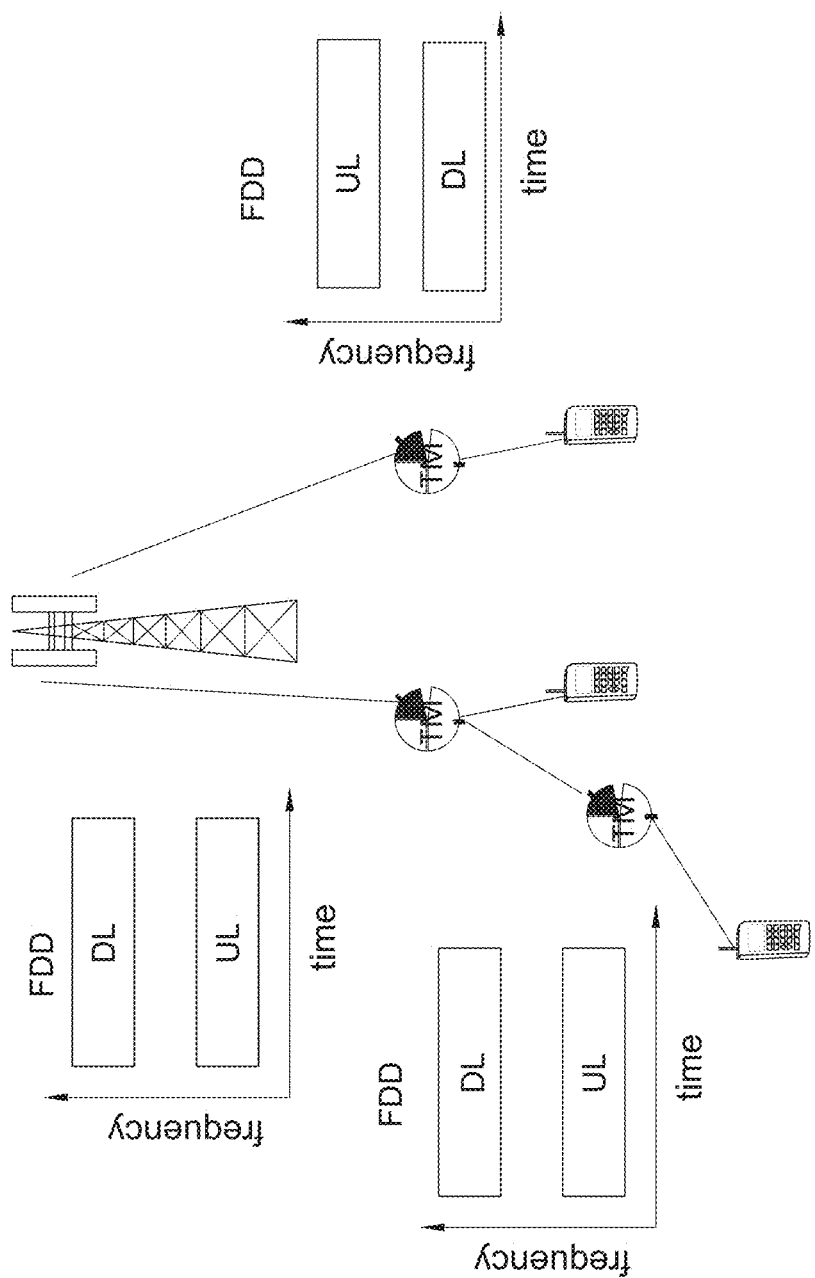

FIG. 16 is an example of how the RF front end may be used in a relay system.

It is appreciated that the deployment may be in TDD only, such that the FDD macro is not necessary.

Referring again to FIG. 2, it is appreciated that provision of 4 switches (top left, top right, bottom left, bottom right), as illustrated, is merely exemplary; other combinations of switches and filters are possible, depending inter alia on the specification of the switch and/or filter. Also, other particulars are merely exemplary, such as the indication that one duplexer is 0.25 w and the other 1 w. Most commercially available small switches\duplexers are in the 0.25-1 W working area.

Typically, the top switches comprise band selector filters, whereas the bottom switches may be configured and operative for switching between Tx time and Rx time. Typically, the 2 duplexers and the rUE (or mobile station functionality) and the rBS (or base station functionality) are all co-located in the same relay.

The dashed line indicates the interference of the Tx\Rx portion of the UE (or mobile station) over the Tx\Rx portion of the eNB or base station. The worst case is typically when the eNB or base station is transmitting and the rUE (or mobile station functionality) or mobile station functionality is receiving; in this case there may be 1 W transmitted through the antenna of the eNB or base station and the rUE (or mobile station functionality) may be trying to listen to a very low power LTE signal that comes from a distant eNB or base station. The duplexer at rUE (or mobile station functionality) is typically selected to be able to reject the adjust channel interference of the eNB or base station.

According to one embodiment, only fdd is employed, however, each side uses a different sub-band. For example, relay a might transmit in subband a and receive in subband b whereas relay b might transmit and receive in subband b.

It is appreciated that the cellular communication standards eg lte define both a time phase and a frequency phase. The term "phase" as used herein refers to one or another of these, as may be appreciated by the context. For example, for tdd use-cases, in the relay, there is a base station (functionality) which is interfering thus neighboring relays can only be measured when (in the time phase in which) that base station is not interfering (ie. neighboring relays can only be measured in the appropriate time-phase). In contrast, when a channel's quality or power is/are measured and handover to a neighboring cell/relay are being considered. If the frequency is in the correct phase the measuring results will be good enough to allow quality decision making (e.g. on whether to handover) whereas if the frequency is note in the correct phase the measuring results may not be good enough to allow quality decision making.

It is appreciated that terminology such as "mandatory", "required", "need" and "must" refer to implementation choices made within the context of a particular implementation or application described herewithin for clarity and are not intended to be limiting, since in an alternative implementation, the same elements might be defined as not mandatory and not required, or might even be eliminated altogether.

It is appreciated that software components of the present invention including programs and data may, if desired, be implemented in ROM (read only memory) form including CD-ROMs, EPROMs and EEPROMs, or may be stored in any other suitable typically non-transitory computer-readable medium such as but not limited to disks of various kinds, cards of various kinds and RAMs. Components described herein as software may, alternatively, be implemented wholly or partly in hardware, if desired, using conventional techniques. Conversely, components described herein as hardware may, alternatively, be implemented wholly or partly in software, if desired, using conventional techniques.

Included in the scope of the present invention, inter alia, are electromagnetic signals carrying computer-readable instructions for performing any or all of the steps of any of the methods shown and described herein, in any suitable order; machine-readable instructions for performing any or all of the steps of any of the methods shown and described herein, in any suitable order; program storage devices readable by machine, tangibly embodying a program of instructions executable by the machine to perform any or all of the steps of any of the methods shown and described herein, in any suitable order; a computer program product comprising a computer useable medium having computer readable program code, such as executable code, having embodied therein, and/or including computer readable program code for performing, any or all of the operations within any of the methods shown and described herein, in any suitable order; any technical effects brought about by any or all of the steps of any of the methods shown and described herein, when performed in any suitable order; any suitable apparatus or device or combination of such, programmed to perform, alone or in combination, any or all of the steps of any of the methods shown and described herein, in any suitable order; electronic devices each including a processor and a cooperating input device and/or output device and operative to perform in software any steps shown and described herein; information storage devices or physical records, such as disks or hard drives, causing a computer or other device to be configured so as to carry out any or all of the steps of any of the methods shown and described herein, in any suitable order; a program pre-stored e.g. in memory or on an information network such as the Internet, before or after being downloaded, which embodies any or all of the steps of any of the methods shown and described herein, in any suitable order, and the method of uploading or downloading such, and a system including server/s and/or client/s for using such; and hardware which performs any or all of the steps of any of the methods shown and described herein, in any suitable order, either alone or in conjunction with software. Any computer-readable or machine-readable media described herein is intended to include non-transitory computer- or machine-readable media.

Any computations or other forms of analysis described herein may be performed by a suitable computerized method. Any step described herein may be computer-implemented. The invention shown and described herein may include (a) using a computerized method to identify a solution to any of the problems or for any of the objectives described herein, the solution may include at least one of a decision, an action, a product, a service or any other information described herein that impacts, in a positive manner, a problem or objectives described herein; and (b) outputting the solution.

The scope of the present invention is not limited to structures and functions specifically described herein and is also intended to include devices which have the capacity to yield a structure, or perform a function, described herein, such that even though users of the device may not use the capacity, they are, if they so desire, able to modify the device to obtain the structure or function.

Features of the present invention which are described in the context of separate embodiments may also be provided in combination in a single embodiment.

For example, a system embodiment is intended to include a corresponding process embodiment. Also, each system embodiment is intended to include a server-centered "view" or client centered "view", or "view" from any other node of the system, of the entire functionality of the system, computer-readable medium, apparatus, including only those functionalities performed at that server or client or node.

Conversely, features of the invention, including method steps, which are described for brevity in the context of a single embodiment or in a certain order may be provided separately or in any suitable subcombination or in a different order. "e.g." is used herein in the sense of a specific example which is not intended to be limiting. Devices, apparatus or systems shown coupled in any of the drawings may in fact be integrated into a single platform in certain embodiments or may be coupled via any appropriate wired or wireless coupling such as but not limited to optical fiber, Ethernet, Wireless LAN, HomePNA, power line communication, cell phone, PDA, Blackberry GPRS, Satellite including GPS, or other mobile delivery. It is appreciated that in the description and drawings shown and described herein, functionalities described or illustrated as systems and sub-units thereof can also be provided as methods and steps therewithin, and functionalities described or illustrated as methods and steps therewithin can also be provided as systems and sub-units thereof. The scale used to illustrate various elements in the drawings is merely exemplary and/or appropriate for clarity of presentation and is not intended to be limiting.

The invention claimed is:

1. A cellular network communication method comprising:
providing at least one cellular network relay which supports operation when any of plural signal separation technologies are used,
wherein the relay includes a base station functionality, aka BSF, and a mobile station functionality, aka MSF, and
wherein, when a base station functionality starts up, the relay's operation includes:
BSFs co-located MSF searches for a remote base station in Rx and Tx sub-bands, and wherein a relay controller switches each sub-band at least once;
the mobile station functionality connects to one of the available base stations thereby to provide a backhauling sub-band;
a co-located base station starts up on an EARFCN of a sub-band other than the backhauling sub-band thereby to define an access sub-band, such that a mobile station functionality is working in one frequency sub-band and a co-located base station functionality is working in another frequency sub-band, thus there is no interference between the co-located mobile station functionality and base station functionality; and mobile station functionality measures other neighboring base stations that are on the backhauling sub-band, or all base stations in bands where the base station is not transmitting, thereby to measure without suffering interference from the base station, since the base station and mobile station functionality are in different sub-bands.

2. The method according to claim 1, wherein said plural technologies include both FDD and TDD.

3. The method according to claim 1, wherein the relay finds neighboring relays which are in the same phase as the phase of an interfering signal thereby to facilitate in-band backhauling for dynamic topologies.

4. The method according to claim 1, wherein the relay is operative to cope with internal interference between the relay's own access and the relay's own backhauling, when operating in TDD thereby to facilitate in-band backhauling for dynamic topologies.

5. The method according to claim 1, wherein the relay allows the cellular network to extend its coverage in areas with poor cellular coverage thereby to facilitate in-band backhauling for dynamic topologies.

6. The method according to claim 5, wherein said relay comprises a single front-end which implements plural separation technologies.

7. The method according to claim 6, wherein said technologies include FDD.

8. The method according to claim 6, wherein said technologies include TDD.

9. The method according to claim 1, wherein an RF front end supporting both TDD and FDD is provided and wherein in case of FDD, in UL operation, each signal travels from an antenna to a duplexer, and is received in the Rx side of the duplexer and travels from an FDD/TDD switch to a switch that maps directly to a low-noise amplifier (LNA) that goes to a down converter, whereas in downlink operation, each RF signal travels from a baseband processor to a power amplifier.

10. The method according to claim 1, wherein, when an FDD/TDD switch and a switch that maps directly to a low-noise amplifier (LNA) that goes to a down converter, are both in FDD mode, each signal is transferred directly to a Tx side of a duplexer.

11. The method according to claim 1, wherein an RF front end supporting both TDD and FDD is provided and wherein, in case of TDD, the system switches between Tx\Rx time on a single frequency and wherein a sub-band switch is operative to switch between Tx and Rx sides of a duplexer to determine which side is to be used in current mode, and wherein for UL, the signal travels from an antenna to a duplexer and the duplexer splits the frequency to the Rx\Tx side and wherein for Tx or Rx the signal goes to a FDD\TDD switch and from there to a sub-band switch operative for mapping between a current working sub-band to a Rx\Tx portion of the RF chain, then to an Rx\Tx switch in Rx mode.

12. The method according to claim 1, wherein, when the system is in TDD Tx mode, a TDD\FDD switch is on TDD mode, each signal goes to an TX\Rx switch, then to a sub-band switch, then to a Tx or Rx side of a duplexer, and then to an antenna.

13. A system according to claim 1, wherein the base station functionality starts up in a system-up process.

14. A system according to claim 1, wherein said frequency sub-band comprises a backhauling sub-band.

15. A cellular communication system including:
a cellular communication network relay which supports operation when any of plural signal separation technologies are used,
wherein the relay includes a base station functionality, aka BSF, and a mobile station functionality, aka MSF, and
wherein, when a base station functionality starts up, the relay's operation includes:
BSFs co-located MSF searches for a remote base station in Rx and Tx sub-bands, and wherein a relay controller switches each sub-band at least once;
the mobile station functionality connects to one of the available base stations thereby to provide a backhauling sub-band;
a co-located base station starts up on an EARFCN of a sub-band other than the backhauling sub-band thereby to define an access sub-band, such that a mobile station functionality is working in one frequency sub-band and a co-located base station functionality is working in another frequency sub-band, thus there is no interference between the co-located mobile station functionality and base station functionality; and
mobile station functionality measures other neighboring base stations that are on the backhauling sub-band, or all base stations in bands where the base station is not transmitting, thereby to measure without suffering interference from the base station, since the base station and mobile station functionality are in different sub-bands.

16. The system according to claim 7, wherein the relay comprises an RF communication system supporting both TDD and FDD and including:
an FDD duplexer coupled to an antenna;
a first pair of FDD/TDD switches each coupled to the duplexer and to a Tx/Rx switch via a sub-band switch; and
a second pair of FDD/TDD switches coupled to the Tx/Rx switch including a first FDD/TDD switch coupled to a baseband processor via an amplifier and down converter and a second FDD/TDD switch coupled to a baseband processor via a second amplifier and up converter.

17. A system according to claim 16, wherein the first FDD/TDD switch is coupled to a first baseband processor via the first amplifier and down converter and the second FDD/TDD switch is coupled to a second baseband processor via the second an amplifier and up converter.

18. A system according to claim 16, wherein the first FDD/TDD switch is coupled to a first baseband processor via the first amplifier and down converter and the second FDD/TDD switch is coupled to said first baseband processor via the second amplifier and up converter.

19. The system according to claim 15, wherein the relay operates within a network compliant with a conventional cellular network protocol and wherein the relay is itself compliant with the conventional cellular network protocol.

20. The system according to claim 19, wherein said protocol comprises LTE.

21. A system according to claim 15, wherein at least one of the plural signal separation technologies are used to separate received signals from transmitted signals.

* * * * *